(12) United States Patent
Li et al.

(10) Patent No.: US 7,417,266 B1
(45) Date of Patent: Aug. 26, 2008

(54) MOSFET HAVING A JFET EMBEDDED AS A BODY DIODE

(75) Inventors: Jian Li, Sunnyvale, CA (US); Daniel Chang, Fremont, CA (US); Ho-Yuan Yu, Saratoga, CA (US)

(73) Assignee: QSpeed Semiconductor Inc., Santa Clara, CA (US)

( * ) Notice: Subject to any disclaimer, the term of this patent is extended or adjusted under 35 U.S.C. 154(b) by 13 days.

(21) Appl. No.: 11/149,718

(22) Filed: Jun. 10, 2005

Related U.S. Application Data

(60) Provisional application No. 60/579,020, filed on Jun. 10, 2004.

(51) Int. Cl.
*H01L 27/088* (2006.01)
(52) U.S. Cl. ............... 257/135; 257/272; 257/329; 257/330; 257/E29.26; 257/E29.265
(58) Field of Classification Search ............... 257/328, 257/302, 329, 330, 331, 332, 333, 134, 135, 257/272, E29.201, E29.26, E29.265; 438/212, 438/270, 272, 273
See application file for complete search history.

(56) References Cited

U.S. PATENT DOCUMENTS

| 4,967,243 | A * | 10/1990 | Baliga et al. ............. 257/342 |
| 5,689,128 | A * | 11/1997 | Hshieh et al. ............. 257/331 |
| 6,809,375 | B2 * | 10/2004 | Takemori et al. ........... 257/330 |
| 7,084,456 | B2 * | 8/2006 | Williams et al. ........... 257/329 |
| 7,109,551 | B2 * | 9/2006 | Sugi et al. ................ 257/330 |
| 7,118,970 | B2 * | 10/2006 | Das et al. ................. 438/268 |
| 2001/0001494 | A1 * | 5/2001 | Kocon ..................... 257/328 |
| 2005/0215012 | A1 * | 9/2005 | Williams et al. ........... 438/270 |

\* cited by examiner

*Primary Examiner*—Minh-Loan T Tran
(74) *Attorney, Agent, or Firm*—Morgan, Lewis & Bockius LLP

(57) ABSTRACT

A field effect transistor, in accordance with one embodiment, includes a metal-oxide-semiconductor field effect transistor (MOSFET) having a junction field effect transistor (JFET) embedded as a body diode.

18 Claims, 13 Drawing Sheets

US 7,417,266 B1

MOSFET HAVING A JFET EMBEDDED AS A BODY DIODE

CROSS-REFERENCE TO RELATED APPLICATIONS

This Application claims the benefit of U.S. Provisional Patent Application No. 60/579,020 filed Jun. 10, 2004.

BACKGROUND OF THE INVENTION

Referring to FIG. 1, a cross sectional view of a trench metal-oxide-semiconductor field effect transistor (TMOSFET) 100 according to the conventional art is shown. The TMOSFET 100 includes a source contact 110, a plurality of source regions 115, a plurality of gate regions 120, a plurality of gate insulator regions 125, a plurality of body regions 130, 135 a drain region 140, 145 and drain contact 150. The drain region 140, 145 may optionally include a first drain region 140 and a second drain region 145. The body regions may optionally include first body regions 130 and second body regions 135.

The body regions 130, 135 are disposed above the drain region 140, 145. The source regions 115, gate regions 120 and the gate insulator regions 125 are disposed within the body regions 130. The gate regions 120 and the gate insulator regions 125 may extend into a portion of the drain region 140, 145. The gate regions 120 and the gate insulator regions 125 are formed as parallel-elongated structures. The gate insulator regions 125 surround the gate regions 120. Thus, the gate regions 120 are electrically isolated from the surrounding regions by the gate insulator regions 125. The gate regions 120 are coupled to form a common gate of the device 100. The source regions 115 are coupled to form a common source of the device 100, by the source contacts 110. The source contact 110 also couples the source regions 115 to the body regions 130, 135.

The source regions 115 and the drain regions 140, 145 may be n-doped (N) semiconductor such as silicon doped with Phosphorus or Arsenic. The body regions 130, 135 may be p-doped (P) semiconductor, such as silicon doped with Boron. The gate region 120 may be n-doped (N) semiconductor, such as polysilicon doped with Phosphorus. The gate insulator regions 125 may be an insulator, such as silicon dioxide.

When the potential of the gate regions 120, with respect to the source regions 115, is increased above the threshold voltage of the device 100, a conducting channel is induced in the body regions 130, 135 along the periphery of the gate insulator regions 125. The TMSOFET 100 will then conduct current between the drain region 140, 145 and the source regions 115. Accordingly, the device is in its on state.

When the potential of the gate regions 120 is reduced below the threshold voltage, the channel is no longer induced. As a result, a voltage potential applied between the drain region 140, 145 and the source regions 115 will not cause current to flow there between. Accordingly, the device 100 is in its off state and the junction formed by the body regions 130, 135 and the drain region 140, 145 supports the voltage applied across the source and drain.

If the drain region 135, 140 includes a first drain region 140 disposed above a second drain region 145, the first drain region 140 is lightly n-doped (N−) semiconductor, such as silicon doped with Phosphorus or Arsenic, and the second drain region 145 is heavily n-doped (N+) semiconductor, such as silicon doped with Phosphorus or Arsenic. If the body regions 130, 135 include first body regions 130 disposed between the source regions 115 and the first drain region 140 proximate the gate regions 120, the first body regions 130 are moderately to lightly p-doped (P or P−) semiconductor, such as silicon doped with Boron, and the second body regions 235 are heavily p-doped (P+) semiconductor, such as silicon doped with Boron. The first drain region 140 and the first body regions 130 reduce the punch through effect. Accordingly, the first drain region 140 and the first body regions 130 act to increase the breakdown voltage of the TMOSFET 100.

Referring now to FIG. 2, a cross sectional view of a non-trench based metal-oxide-semiconductor field effect transistor (MOSFET) 200 according to the conventional art is shown. The MOSFET 200 includes a source contact 210, a plurality of source regions 215, a plurality of gate regions 220, a plurality of gate insulator regions 225, a plurality of body regions 230, 235 a drain region 240, 245 and a drain contact region 250. The drain region 240, 245 may optionally include a first drain region 240 and a second drain region 245. The body regions 230, 235 may optionally include first body regions 230 and second body regions 235.

The source regions 215 are formed as parallel elongated structures disposed above the drain region 240, 245. The body regions 230, 235 are disposed between the source regions 215 and the drain region 240, 245. The gate regions 220 are disposed above the drain regions 240, 245 and the body regions 230, 235. The gate regions 220 are disposed between the source regions 215 above the drain regions 240, 245. Accordingly, a portion of the drain region 240, 245 is disposed between the body regions 230, 235 proximate the gate regions 220. The gate insulator regions 225 surround the gate region 220. Thus, the gate regions 220 are electrically isolated from the surrounding regions by the gate insulator regions 225. The gate regions 220 may be coupled to form a common gate of the device 200. The source contact 210 may be disposed on the source regions 215 and the body regions 230, 235. The source regions 215 may be coupled to form a common source of the device 200, by the source contact 210. The source contact 210 also couples the source regions 215 to the body regions 230, 235.

The source regions 215 and the drain region 240, 245 may be n-doped semiconductor, such as silicon doped with Phosphorus or Arsenic. The body regions 230, 235 may be p-doped semiconductor, such as silicon doped with Boron. The gate regions 220 may be n-doped semiconductor, such as polysilicon doped with Phosphorus. The gate insulator region 225 may be an insulator, such as silicon dioxide.

When the potential of the gate regions 220, with respect to the source regions 215, is increased above the threshold voltage of the device 200, a conducting channel is induced in the body regions 230, 235 between the source regions 215 and the drain region 240, 245 proximate the gate regions 220. The MOSFET 200 will then conduct current between the drain region 240, 245 and the source regions 215. Accordingly, the device 200 is in its one state.

When the potential of the gate regions 220 is reduced below the threshold voltage, the channel is no longer induced. As a result, a voltage potential applied between the drain region 240, 245 and the source regions 215 will not cause current to flow there between. Accordingly, the device 200 is in its off state and the junction formed by the body regions 230, 235 and the drain region 240, 245 supports the voltage applied across the source and drain.

If the drain region 240, 245 includes a first drain region 240 disposed above a second drain region 245 proximate the body regions 230, 235 and the gate regions 220, the first drain region 240 is moderately to lightly n-doped (N or N−) semiconductor and the second drain region 245 is heavily n-doped (N+) semiconductor. If the body regions 230, 235 includes first body regions 230 disposed between the source regions 215 and the first drain region 240 proximate the gate regions 220, the first body regions 230 are moderately to lightly p-doped (P or P−) semiconductor and the second body regions 235 are heavily p-doped (P+) semiconductor. The first drain region 240 and the first body regions 230 reduce the punch through effect. Accordingly, the first drain region 240 and the first body regions 235 act to increase the breakdown voltage of the MOSFET 200.

However, the intrinsic P-N body diode in such conventional MOSFET devices exhibit a long reverse recovery time due to the nature of the P-N depletion region, leading to excessive power loss during switching. Furthermore, the conventional MOSFET devices exhibit relatively high forward voltage drops across the body diode. Accordingly, the reverse recovery is relatively long for current applications, such as high frequency switching mode DC-DC converters.

SUMMARY OF THE INVENTION

Embodiments of the present invention provide a field effect transistor comprising a metal-oxide-semiconductor field effect transistor (MOSFET) having a junction field effect transistor (JFET) embedded as a body diode. In one embodiment, the field effect transistor includes first and second gate regions, first and second source regions, first and second body regions, a drain region, a source contact, and first and second gate insulator regions. The first and second source regions may be disposed proximate respective first and second gate regions. The first and second body regions may be disposed adjacent the respective source regions proximate the corresponding gate regions. The drain region may be disposed between the first and second body regions proximate the first and second gate regions. Accordingly, the first and second body regions are disposed between the drain region and the respective source regions. The source contact electrically couples the first and second source regions, the first and second body regions and corresponding portions of the drain region disposed between the first and second body regions. The first and second gate insulator regions are disposed between the respective gate regions, source regions, body regions, drain regions and the source contact.

Embodiments of the present invention also provide methods of manufacturing a field effect transistor comprising a metal-oxide-semiconductor field effect transistor (MOSFET) having a junction field effect transistor (JFET) embedded as a body diode. In one embodiment, the method includes depositing a first semiconductor layer upon a substrate. The first semiconductor layer and substrate may be doped with a first type of impurity. A first portion of the first semiconductor layer may be doped with a second type of impurity to form a first plurality of well regions. A second portion of the first semiconductor layer may be doped with the second type of impurity to form a second plurality of well regions substantially centered within the first plurality of well regions. A third portion of the first semiconductor layer may be doped with the first type of impurity to form a third plurality of well regions substantially centered within the second plurality of well regions. A plurality of trenches may be etched in the first semiconductor layer substantially centered within the first, second and third plurality of well regions. A dielectric layer may be formed proximate the plurality of trenches and a second semiconductor layer may be deposited in the plurality of trenches lined by the dielectric layer. The second dielectric layer may be doped with the first type of impurity. A metal layer may be deposited such that the first, second and third plurality of well regions and a fourth portion of the first semiconductor layer disposed between the second plurality of well regions are electrically coupled to each other.

Embodiments of the present invention provide FET devices having low leakage current and/or faster switching, as compared to conventional power MOSFET devices. Accordingly, the JFET devices may advantageously be utilized in many applications such as high-frequency DC-DC converters and the like.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
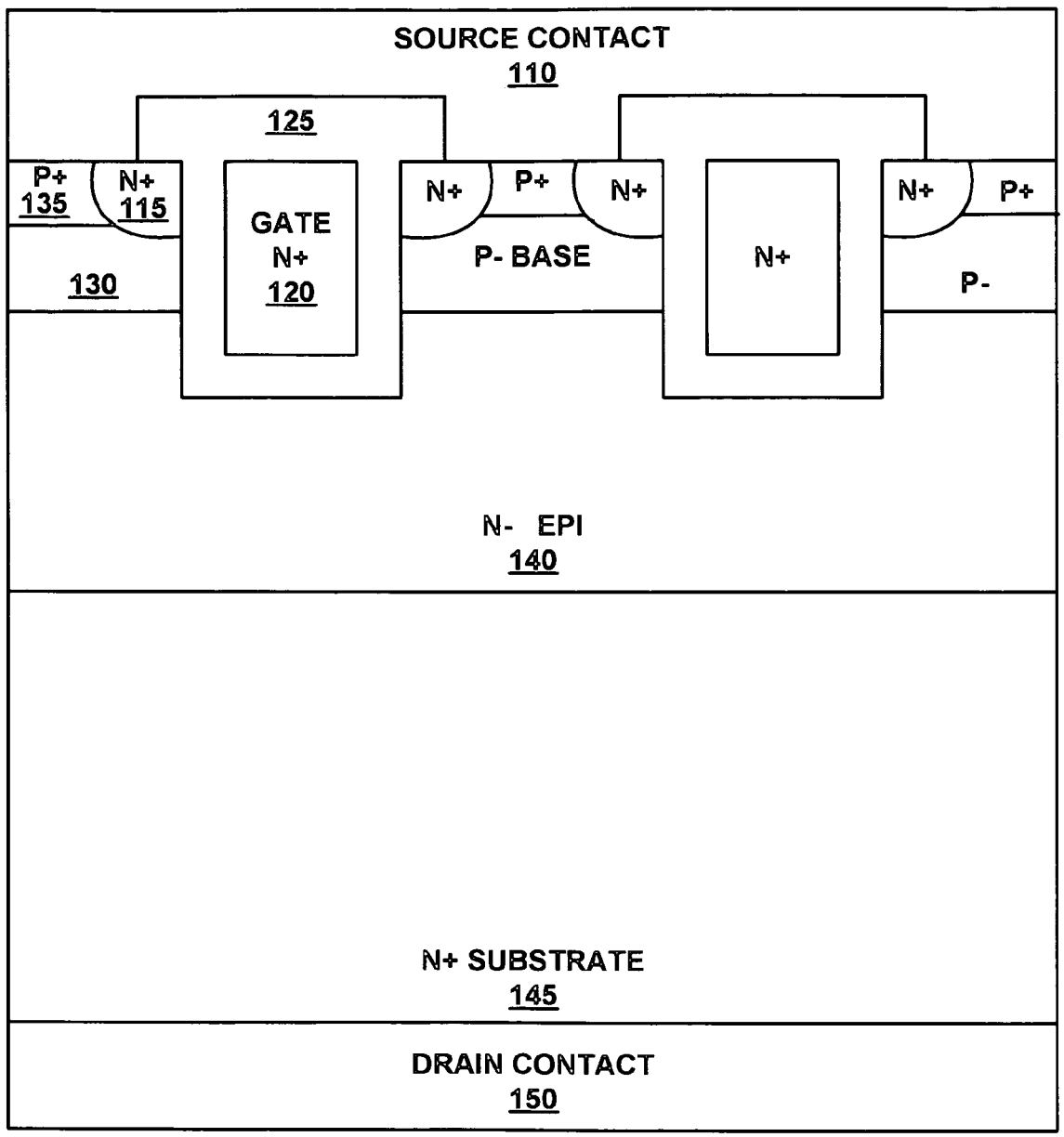
FIG. 1 shows a cross sectional view of a trench metal-oxide-semiconductor field effect transistor (TMOSFET) according to the conventional art.
Figure 2:
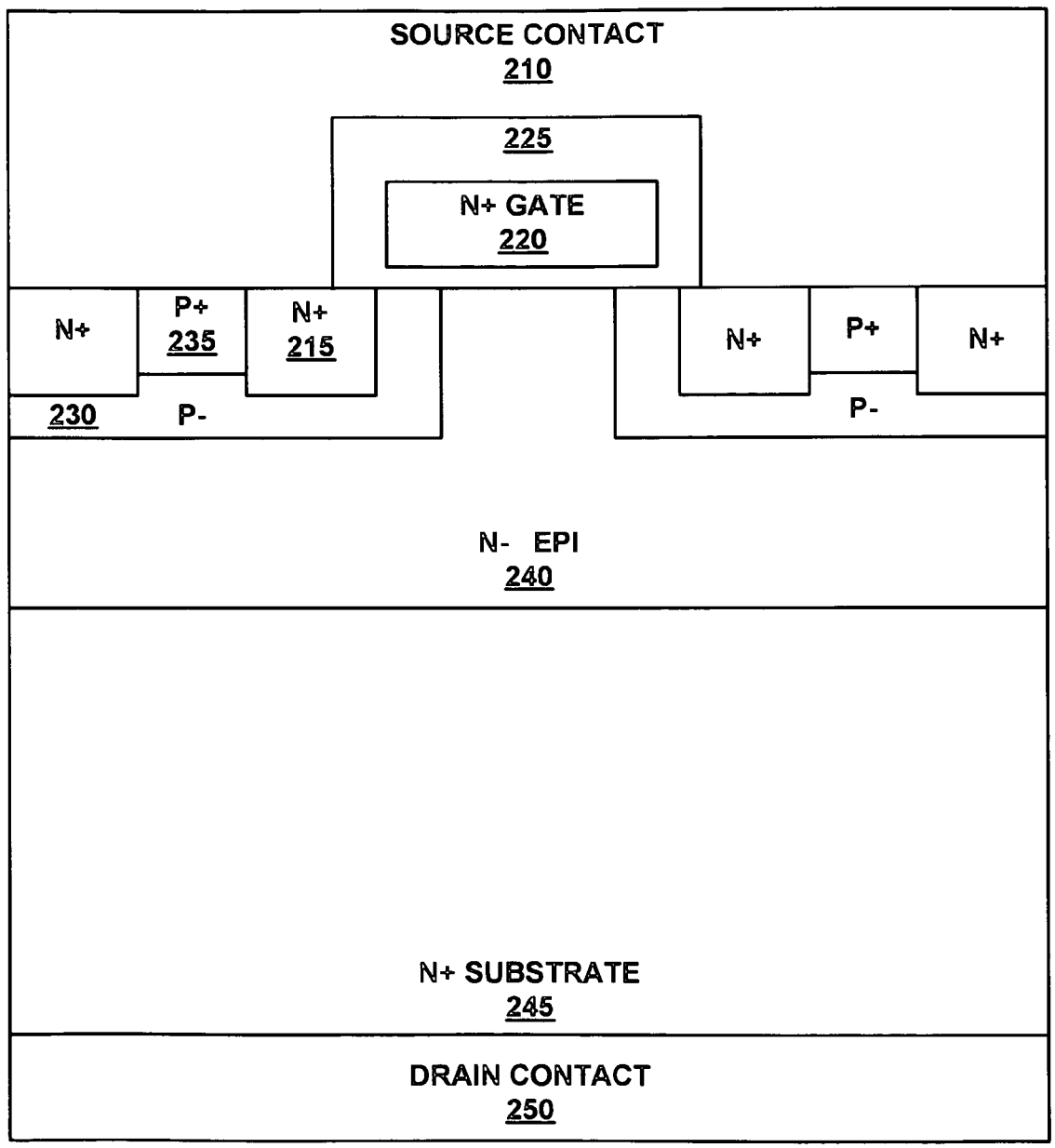
FIG. 2 shows a cross sectional view of a non-trench based metal-oxide-semiconductor field effect transistor (MOSFET) according to the conventional art.
Figure 3A:
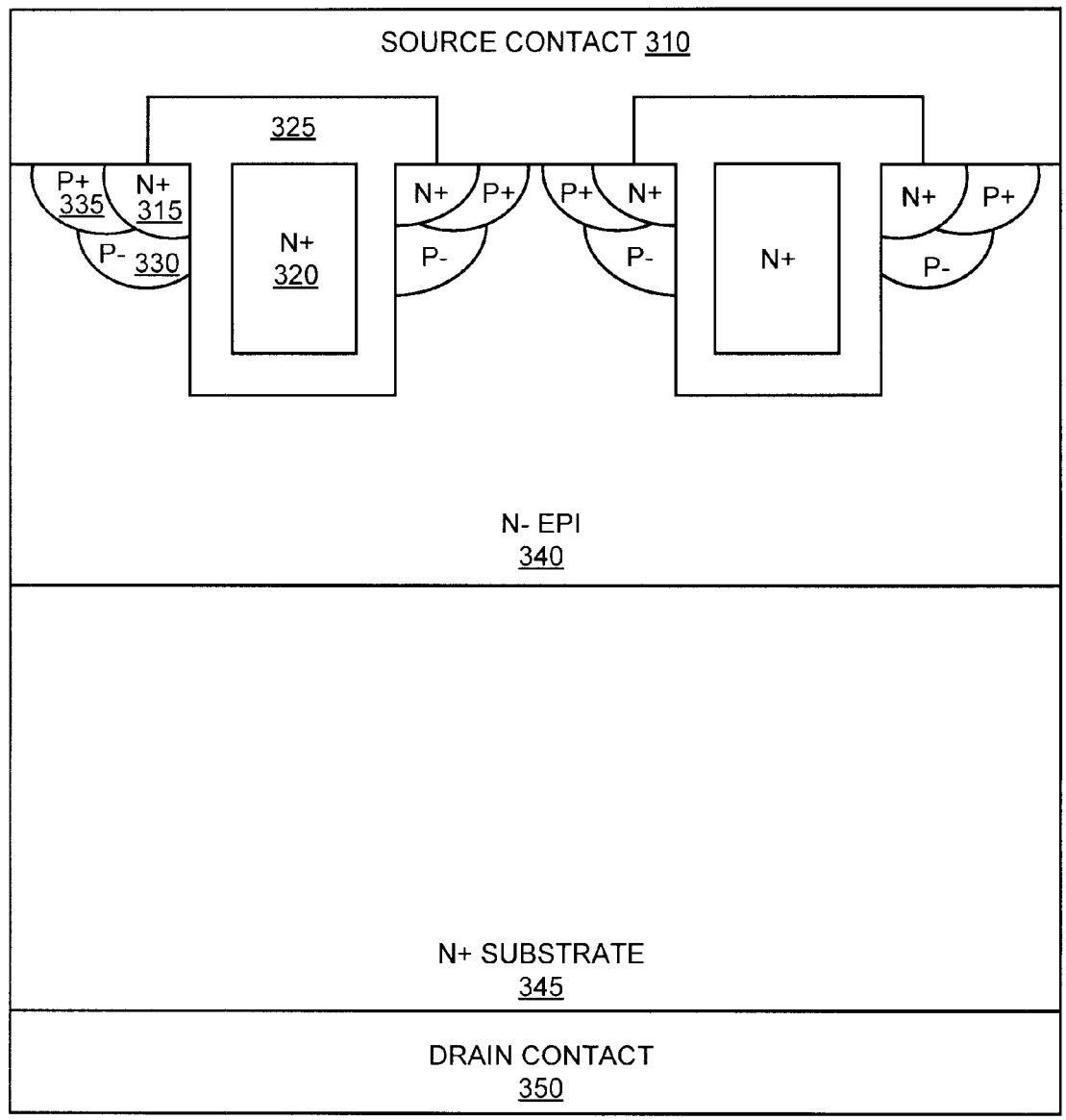
FIG. 3A shows a cross sectional view of a field effect transistor (FET), in accordance with one embodiment of the present invention.

Referring to FIG. 3A, a cross sectional view of a field effect transistor (FET) 300, in accordance with one embodiment of the present invention, is shown. The FET device 300 includes a metal-oxide-semiconductor field effect transistor (MOSFET) having a junction field effect transistor (JFET) embedded as a body diode. More specifically, the FET 300 includes a source contact 310, a plurality of source regions 315, a plurality of gate regions 320, a plurality of gate insulator regions 325, a plurality of body regions 330, 335, a drain region 340, 345 and a drain contact 350. The drain region 340, 345 may optionally include a first drain region 340 and a second drain region 345. The body regions 330, 335 may optionally include first body regions 330 and second body regions 335.

The source regions 315 may be formed as parallel elongated structures disposed above the drain region 340, 345 and proximate the gate regions 320. The body regions 330, 335 may be disposed adjacent the source regions 315 and proximate the gate regions 320. The drain region 340, 345 may be disposed the body regions 330, 335 and proximate the gate regions 320. Accordingly, the body regions 330, 335 are disposed between the source regions 315 and the drain region 340, 345. The gate regions 320 may be formed as parallel elongated structures disposed within the source regions 315, the body regions 330, 335 and the drain region 340, 345. The gate insulator regions 325 surround the gate regions 320. Thus, the gate regions 320 are electrically isolated from the surrounding regions by the gate insulator regions 325. The source contact 310 may be disposed on the source regions 315, the body regions 330, 335 and the drain regions 340, 345. Accordingly, the source contact 310 couples the source regions 315 to the body regions 330, 335 and corresponding portion of the drain region 340, 345 disposed between the body regions 330, 335.

The source regions 315, the drain region 340 and the gate regions 320 may be a semiconductor having a first doping type. The body regions may be a semiconductor having a second doping type. In one implementation, the source regions 315 and the drain region 340, 345 may be n-doped semiconductor such as silicon doped with Phosphorus or Arsenic. The body regions 330, 335 may be p-doped semiconductor, such as silicon doped with Boron. The gate regions 320 may be n-doped semiconductor, such as polysilicon doped with Phosphorus. The gate insulator regions 325 may be an insulator, such as silicon dioxide.

Figure 3B:
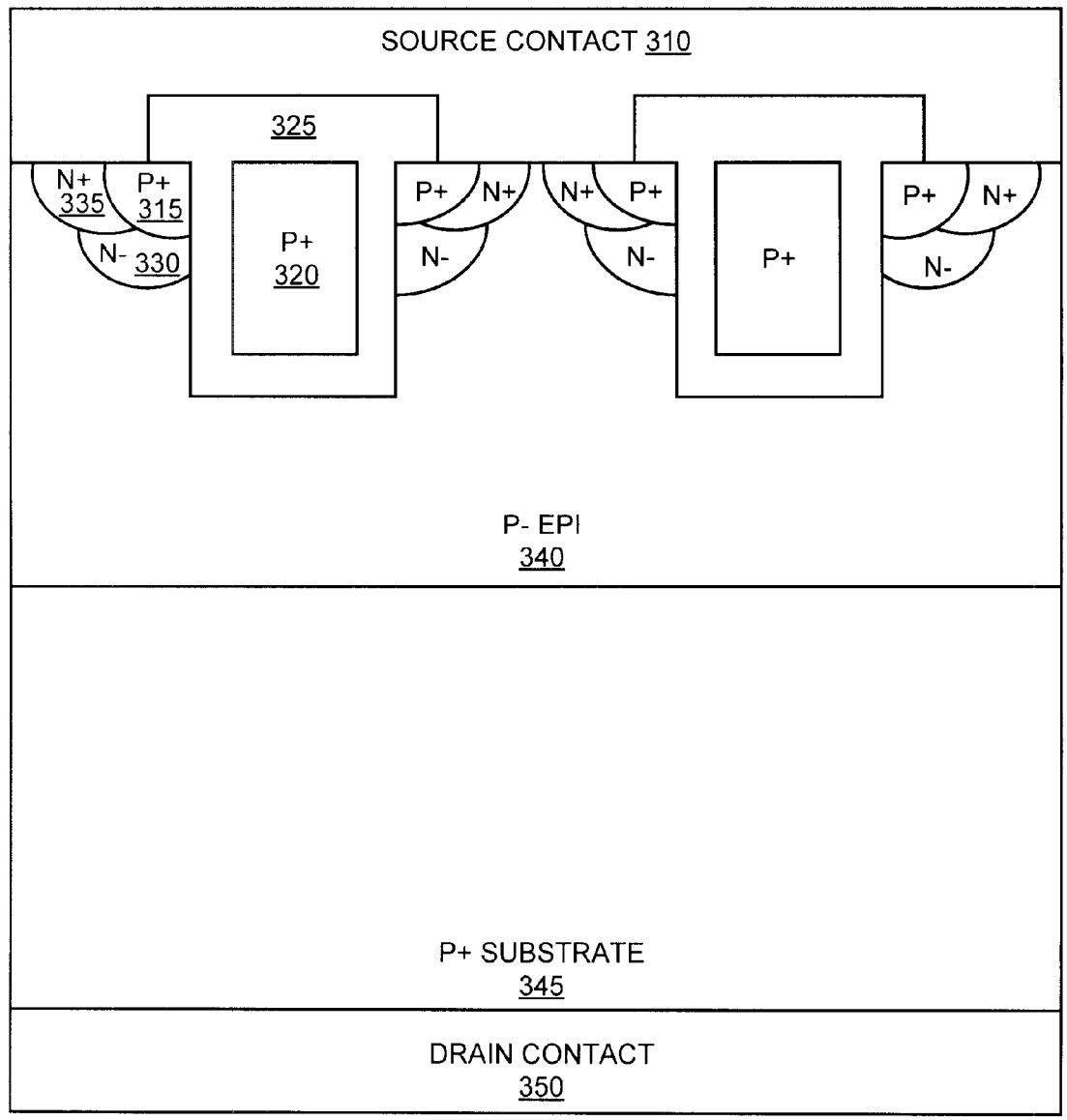
FIG. 3B shows a cross sectional view of a field effect transistor (FET), in accordance with another embodiment of the present invention.

In another implementation (FIG. 3B), the source regions 315 and the drain region 340, 350 may be p-doped semiconductor such as silicon doped with Boron. The body regions 330, 335 may be n-doped semiconductor, such as silicon doped with Phosphorus or Arsenic. The gate regions 320 may be p-doped semiconductor, such as polysilicon doped with Phosphorus. The gate insulator region 325 may be an insulator, such as silicon dioxide.

In another implementation (FIG. 3A), the source regions 315 may be heavily n-doped (N+) semiconductor, such as silicon doped with Phosphorus or Arsenic. The second drain region 345 proximate the drain contact 350 may be heavily n-doped (N+) semiconductor, such as silicon doped with Phosphorus or Arsenic. The first drain region 340 proximate the body region 330, 335 may be moderately to lightly n-doped (N or N−) semiconductor, such as silicon doped with Phosphorus or Arsenic. The first body regions 330 disposed between the source regions 315 and the first drain region 340 proximate the gate regions 320 may be moderately to lightly p-doped (P or P−) semiconductor, such as silicon doped with Boron. The second body regions 335 proximate the source contact 310 may be heavily p-doped (P+) semiconductor, such as silicon doped with Boron. The gate region 320 may heavily n-doped (N+) semiconductor, such as polysilicon doped with Phosphorus. The gate insulator regions 325 may be an insulator, such as silicon dioxide. The source contact 310 may be a metal or a silicide.

In another implementation (FIG. 3B), the source regions 315 may be heavily p-doped (P+) semiconductor, such as silicon doped with Boron. The second drain region 345 proximate the drain contact 350 may be heavily p-doped (P+) semiconductor, such as silicon doped with Boron. The first drain region 340 proximate the body region 330, 335 may be moderately to lightly p-doped (P or P−) semiconductor, such as a silicon doped with Boron. The first body regions 330 disposed between the source regions 315 and the first drain region 340 proximate the gate regions 320 may be moderately to lightly n-doped (N or N−) semiconductor, such as silicon doped with Phosphorus or Arsenic. The second body regions 335 proximate the source contact 310 may be heavily n-doped (N+) semiconductor, such as silicon doped with Phosphorus or Arsenic. The gate region 320 may heavily p-doped (P+) semiconductor, such as polysilicon doped with Boron. The gate insulator regions 325 may be an insulator, such as silicon dioxide. The source contact 310 may be a metal or a silicide.

The gate regions 320 may be coupled to form a common gate of a trench metal-oxide-semiconductor field effect transistor (TMOSFET). The source regions 315 may be coupled to form a common source of the TMOSFET. The body regions 330, 335 may be coupled to form a common body of the TMOSFET, while the portions of the body region disposed proximate the gate regions 320 form a conducting channel of the TMOSFET. The drain region 340, 345 forms the drain of the TMOSFET.

In addition, the portions of the drain region 340, 345 disposed between the body regions 330, 335 forms a conducting channel of a junction field effect transistor (JFET). The body regions 330, 335 form a gate of the JFET. The source contact 310 and the drain region 340, 345 form the source and drain of the JFET. Furthermore, when the source contact 310 is a metal, a Schottky junction is formed at the interface between the source contact 310 and the drain region 340, 345. The Schottky junction in combination with the JFET form a gated Schottky diode. In the gate Schottky diode the gates pinch off the conduction channel during reverse bias, thereby increasing the breakdown voltage of the Schottky junction and reducing the leakage current. During reverse bias recovery, the Schottky diode increases minority carrier injection into the depletion region. In addition, the resulting body diode is in effect a merged PiN diode.

When the potential of the gate regions 320, with respect to the source regions 315, is increased above the threshold voltage of the device 300, a conducting channel is induced in the body region 330, 335 along the periphery of the gate insulator regions 325. The TMOSFET will then conduct current between the drain region 340, 345 and the source regions 315. Accordingly, the device is in its on state.

When the potential of the gate regions 320 is reduced below the threshold voltage, the channel is no longer induced. As a result, a voltage potential applied between the drain region 340, 345 and the source regions 315 will not cause current to flow there between. Accordingly, the TMOSFET is in its off state and the depletion region formed in the portion of the first drain region 340, proximate the body regions 330, 335 supports the voltage applied across the source and drain.

It is appreciated that above-described embodiments may be readily modified to form devices including a plurality of TMOSFETs arranged in stripe cells, hexagonal cells, mesh cells or the like configuration.

Figure 4A:
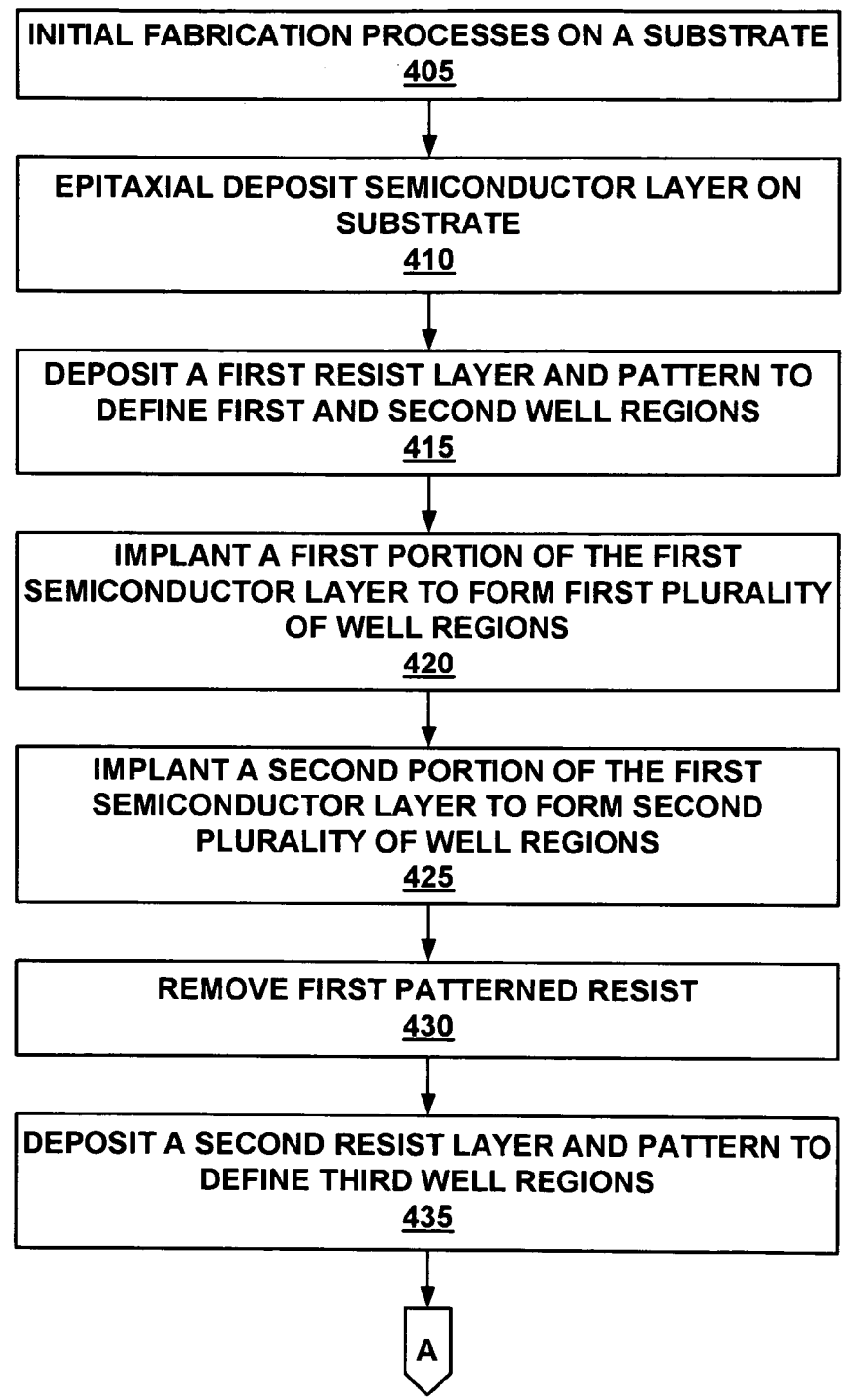
FIGS. 4A, 4B, 4C and 4D show a flow diagram of a method of fabricating a field effect transistor (FET) device, in accordance with one embodiment of the present invention.

Referring now to FIGS. 4A, 4B, 4C and 4D, a flow diagram of a method of fabricating a field effect transistor (FET) device, in accordance with one embodiment of the present invention, is shown. As depicted in FIG. 4A, the method begins, at 405, with various initial processes upon a semiconductor substrate. The various initial processes may include cleaning, depositing, doping, etching and/or the like. The semiconductor substrate may contain a first type of dopant at a first concentration. In an n-channel MOSFET implementation, the substrate may be silicon, gallium arsenide, indium phosphide or the like, heavily doped with Phosphorus or Arsenic (N+) at a concentration of approximately $1.0E17$ $cm^{-3}$ to $1.0E20$ $cm^{-3}$. In a p-channel MOSFET implementation, the substrate may be silicon, gallium arsenide, indium phosphide or the like, heavily doped with Boron (P+).

At 410, a semiconductor layer may be epitaxial deposited upon the substrate. In one implementation, an epitaxial deposited layer of approximately 30 nano-meters (nm) to 400 nm is formed upon the substrate. The epitaxial deposited semiconductor layer may contain the first type of dopant at a second concentration. The semiconductor layer may be doped by introducing the dopant into the epitaxial chamber during deposition. The epitaxial deposited semiconductor layer may also be doped by an optional high-energy implant and thermal anneal process after deposition. In the n-channel MOSFET implementation, the epitaxial deposited semiconductor layer may be silicon, gallium arsenide, indium phosphide or the like, moderately to lightly doped with Phosphorus or Arsenic (N or N−) at a concentration of approximately $5.0E14$ $cm^{-3}$ to $5.0E16$ $cm^{-3}$. In the p-channel MOSFET implementation, the epitaxial deposited semiconductor layer may be silicon, gallium arsenide, indium phosphide or the like, moderately to lightly doped with Boron (P or P−).

At 415, a first photo-resist may be deposited and patterned by any well-known lithography process to define a plurality of body regions. At 420, a second type of dopant may be selectively implanted in the portions of the epitaxial deposited semiconductor layer exposed by the patterned first photo-resist to form a first plurality of well regions. The dopant may be implanted utilizing any well-known ion-implant process at a first energy level. The first doping process results in the formation of first well regions having a second dopant at a third concentration. In the n-channel MOSFET implementation, the first well regions may be moderately to lightly doped with Boron (P or P−)) at a concentration of approximately $5.0E14$ $cm^{-3}$ to $5.0E16$ $cm^{-3}$. In the p-channel MOSFET implementation, the first well regions may be moderately to lightly doped with Phosphorus or Arsenic (N or N−). The first wells form a plurality of lightly to moderately doped body regions of the TMOSFET.

At 425, the second type of dopant may be selectively implanted in the portions of the epitaxial deposited semiconductor layer exposed by the patterned first photo-resist to form a second plurality of well regions disposed above the first well region. The second type of dopant may be implanted at a second energy level that is less than the first energy level. The second doping process results in the formation of second well regions having the second dopant at fourth concentration. In the n-channel MOSFET implementation, the second well regions may be heavily doped with Boron (P or P−) at a concentration of approximately $5.0E16$ $cm^{-3}$ to $1.0E20$ $cm^{-3}$. In the p-channel MOSFET implementation, the second well regions may be heavily doped with Phosphorus or Arsenic (N or N−). The second wells form a plurality of heavily doped body regions of the TMOSFET. The first and second well regions also form a plurality of gate regions of a JFET. The channel of the JFET is formed by a portion of the epitaxial layer disposed between the well regions.

Figure 4B:
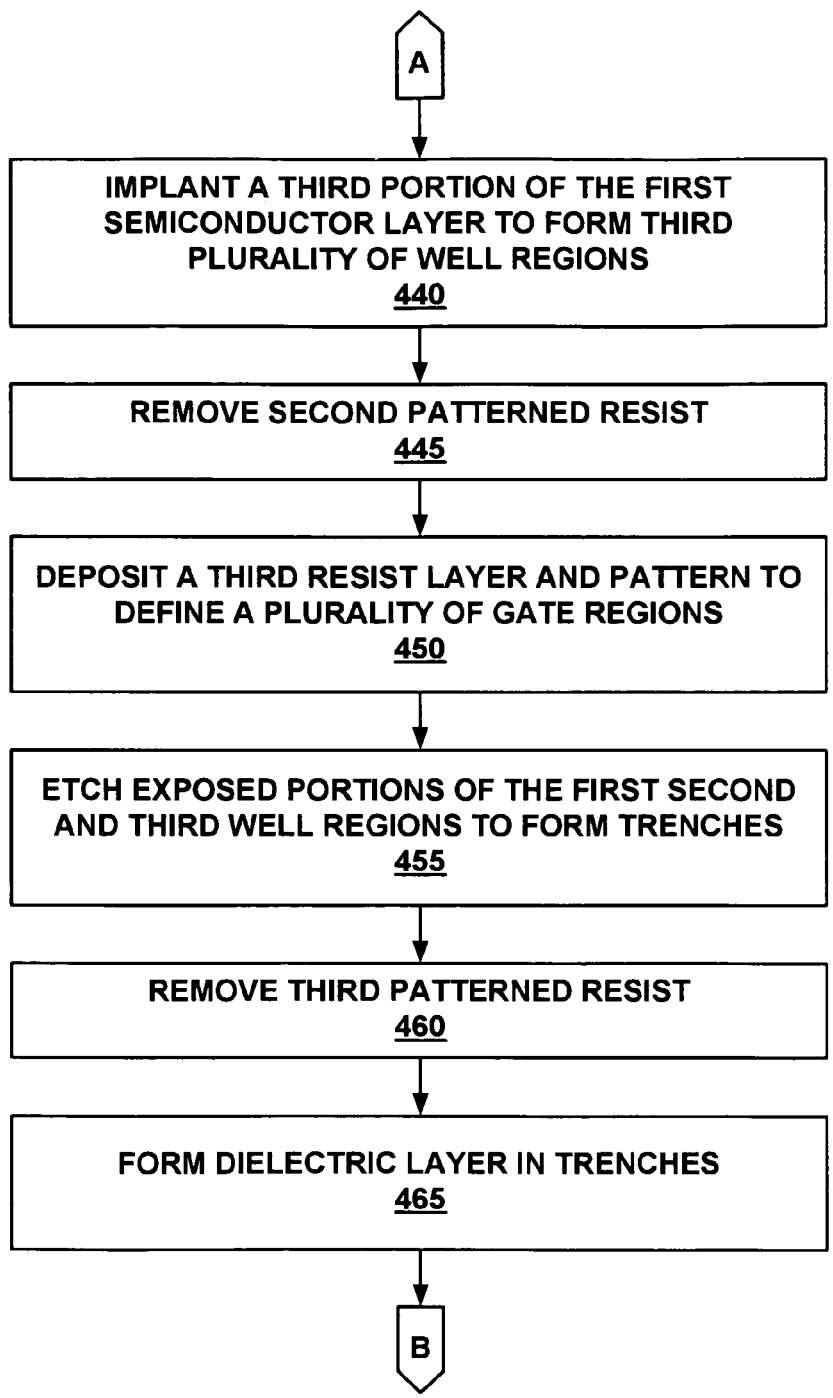

At 430, the first patterned photo-resist is removed utilizing an appropriate resist stripper or resist ashing process. At 435, a second photo-resist may be deposited and patterned by any well-known lithography process to define a plurality of source regions disposed within the body regions. The openings in the second pattern photo-resist are smaller than the first and second well regions. The openings in the second patterned photo-resist are aligned to be substantially centered within the first and second well regions. Referring now to FIG. 4B, the first type of dopant may be selectively implanted in the portions of the epitaxial deposited semiconductor layer exposed by the patterned second photo-resist to form the third plurality of well regions disposed above the first well regions and within the second well regions, at 440. The dopant may be implanted at a third energy level. The third doping process results in the formation of third plurality of well regions having the first dopant at a fifth concentration. In the n-channel MOSFET implementation, the third well regions may be heavily doped with Phosphorus or Arsenic (N+) at a concentration of approximately $1.0E17$ $cm^{-3}$ to $1.0E20$ $cm^{-3}$. In the p-channel MOSFET implementation, the third well regions may be heavily doped with Boron (P+). The third wells form a plurality of source regions of the TMOSFET.

At 445, the second patterned photo-resist is removed utilizing an appropriate resist stripper or resist ashing process. At 450, a third photo-resist may be deposited and patterned by any well-known lithography process to define a plurality of gate regions disposed within the source and body regions. The openings in the third patterned photo-resist are smaller than the third plurality of well regions. The openings in the third pattern photo-resist are aligned to be substantially centered within the first, second and third plurality of well regions. At 455, the portions of the third, second and first well regions exposed by the third patterned photo-resist may be removed by any well-known etching process. In one implementation, the resulting trenches may extend into the epitaxial deposited layer just below the first well region.

At 460, the third patterned photo-resist layer may be removed utilizing an appropriate resist stripper or resist ashing process. At 465, a first dielectric layer may be formed in the epitaxial deposited layer proximate the trenches. The first dielectric layer may be formed by any well-known oxidation or deposition processes. In one implementation, the dielectric is formed by oxidizing the surface of the silicon proximate the trenches to form a silicon dioxide layer. In one implementation the first dielectric layer may be approximately 15 nm to 200 nm thick. The resulting dielectric along the trench walls forms first port-ion of a plurality of gate insulator regions of the TMOSFET.

Figure 4C:
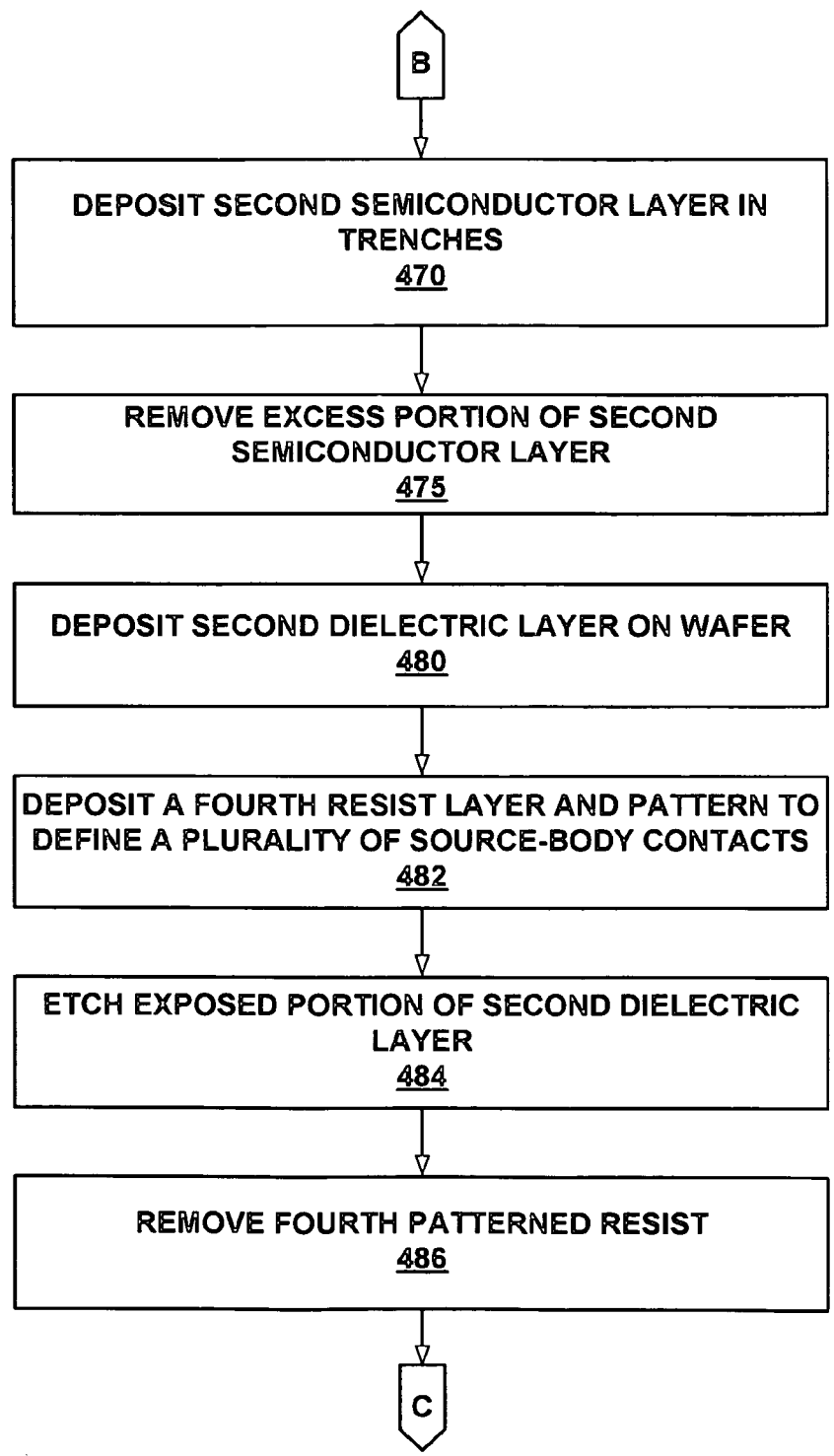

Referring now to FIG. 4C, a second semiconductor layer may be deposited in the trenches to form a plurality gate regions of the TMOSFET, at 470. In one implementation, the polysilicon is deposited in the trenches by a method such as decomposition of silane ($SiH_4$). The polysilicon may be doped by introducing the impurity during the deposition process or in a separate doping process. In the n-channel MOSFET implementation, the polysilicon may be heavily doped with Phosphorus or Arsenic (N+) at a concentration of approximately $1.0E17$ $cm^{-3}$ to $1.0E20$ $cm^{-3}$. In the p-channel MOSFET implementation, the polysilicon may be heavily doped with Boron (P+). At 475, an etch-back process is performed to remove excess polysilicon on the surface of the wafer. The excess polysilicon may be removed utilizing an appropriate etching and/or chemical-mechanical polishing (CMP) process.

At 480, a second dielectric layer is formed on the wafer to complete the gate insulator regions disposed about the gate regions. The second dielectric layer may be formed by any well-known oxidation or deposition processes. At 482, a fourth photo-resist may be deposited and patterned by any well-known lithography process to define a plurality of source-body contact openings between the gate regions. At 484, the portions of the second dielectric layer exposed by the fourth patterned photo-resist may be removed by any well-known etching process. At 486, the fourth patterned photo-resist layer may be removed utilizing an appropriate resist stripper or resist ashing process.

Figure 4D:
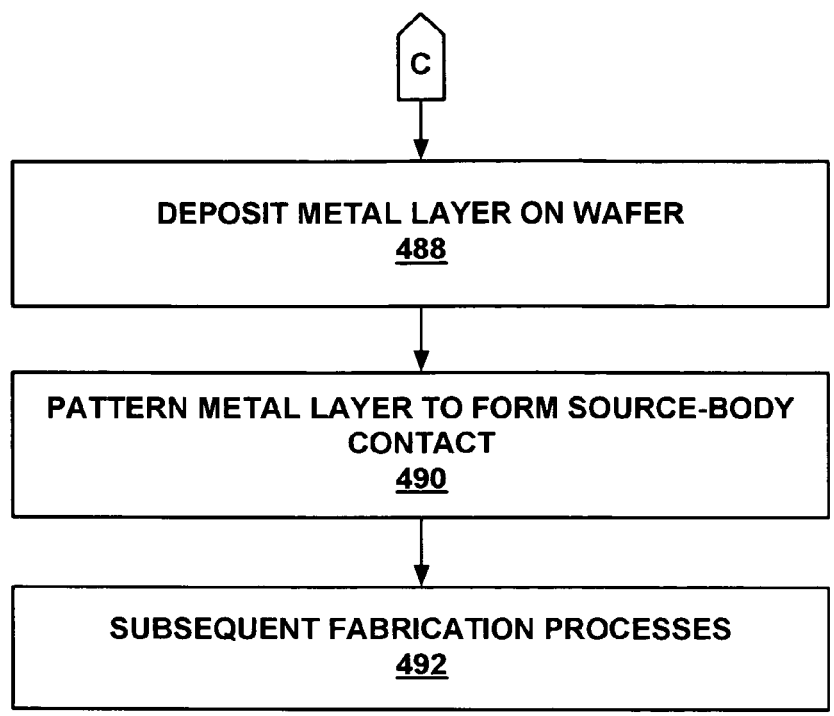

Referring now to FIG. 4D, a metal layer is deposited on the surface of the wafer, at 488. The deposited metal may be deposited such that the first, second and third plurality of well regions and a fourth portion of the first semiconductor layer disposed between the second plurality of well regions are electrically coupled to each other. In one implementation, the source-body metal layer is deposited by any well-known method such as sputtering. The source-body metal layer forms a contact with the body and source regions left exposed by the patterned second dielectric layer. The source-body metal layer is isolated from the gate region by the patterned first and second dielectric layers. The source-body metal layer also forms a Schottky barrier at the interface of the epitaxial deposited layer disposed between the first, second and third well regions. In one implementation, the metal layer may be titanium, cobalt, platinum, their silicides or the like. The metal layer is then patterned utilizing a photo-resist mask and selective etching method to form source-body contact, at 490. At 492, fabrication continues with various other processes. The various processes typically include etching, deposition, doping, cleaning, annealing, passivation, cleaving and/or the like.

Figure 5:
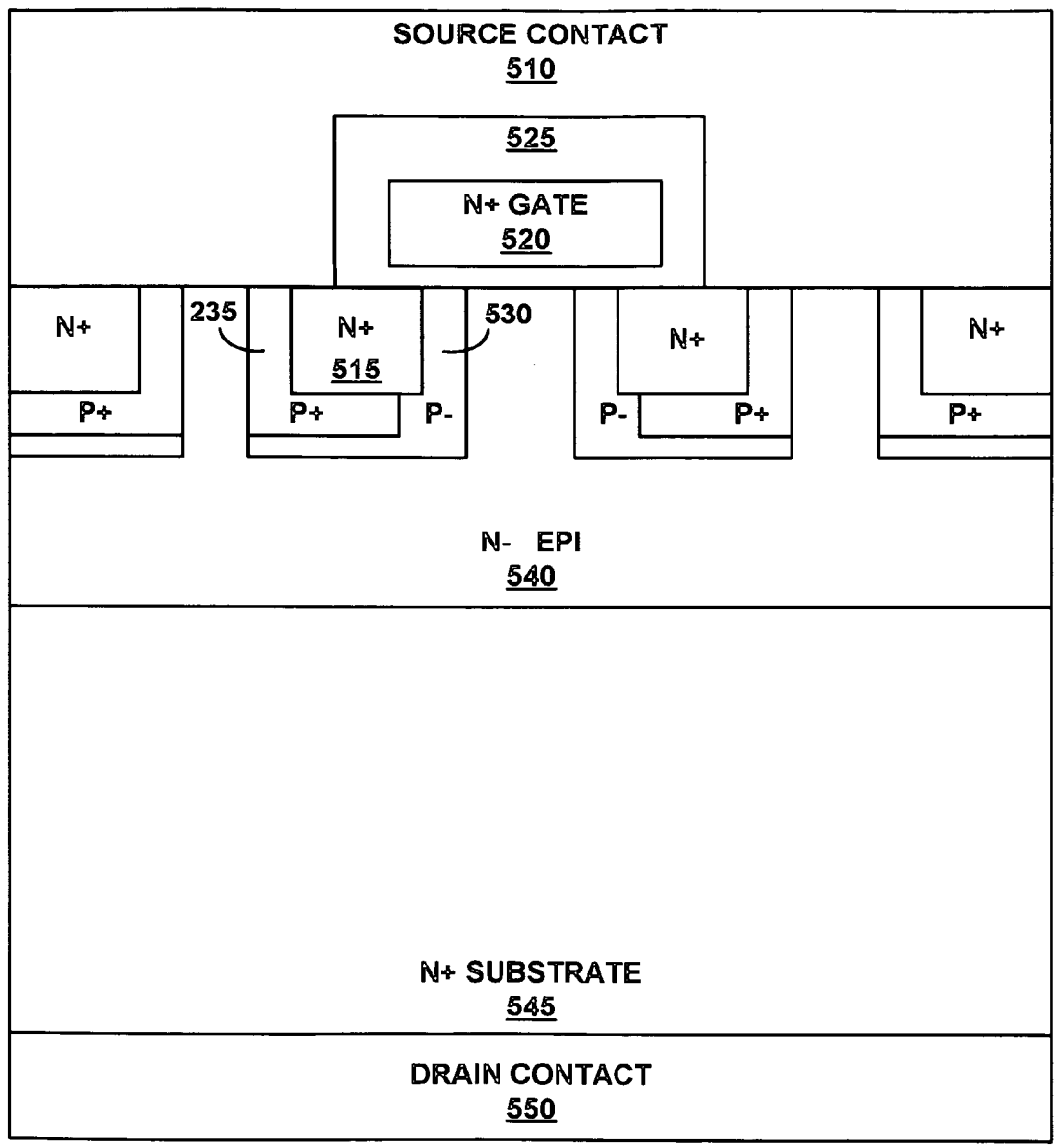
FIG. 5 shows a cross sectional view of a field effect transistor (FET), in accordance with another embodiment of the present invention.

Referring now to FIG. 5, a cross sectional view of a field effect transistor (FET) 500, in accordance with another embodiment of the present invention, is shown. The FET device 500 includes a metal-oxide-semiconductor field effect transistor (MOSFET) having a junction field effect transistor (JFET) embedded as a body diode. More specifically, the FET 500 includes a source contact 510, a plurality of source regions 515, a plurality of gate regions 520, a plurality of gate insulator regions 525, a plurality of body regions 530, 535, a drain region 540, 545 and a drain contact 550. The drain region 540, 545 may optionally include a first drain region 540 and a second drain region 545. The body regions 530, 535 may optionally include first body regions 530 and second body regions 535.

The source regions 515 may be formed as parallel elongated structure disposed above the drain region 540, 545 and proximate the gate regions. The body regions 530, 535 may be disposed adjacent the source regions 515 and proximate the gate regions 530, 535. The gate regions 520 may be formed disposed above the drain region 540, 545 and a portion of the body regions 530, 535. The drain regions 540, 545 may be disposed between the body region 530, 535 and proximate the gate regions. Accordingly, the body regions 530, 535 are disposed between the source regions 515 and the drain regions 540, 545. The gate insulator regions 525 surround the gate regions 520. Thus, the gate regions 520 are electrically isolated from the surrounding regions by the gate insulator regions 525. The source contact 510 may be disposed upon the source regions 515, the body regions 530, 535 and the drain regions 540, 545 between the gate regions 520. Accordingly, the source contact 510 couples the source regions 515 to the body regions 530, 535 and corresponding portions of the drain region 340, 345 disposed between the body regions 330, 335.

The source regions 515, the drain region 540, 545 and the gate regions 520 may be a semiconductor having a first doping type. The body regions 530, 535 may be a semiconductor having a second doping type. In one implementation, the source regions 515 and the drain region 540, 545 may be n-doped semiconductor such as silicon doped with Phosphorus or Arsenic. The body regions 530, 535 may be p-doped semiconductor, such as silicon doped with Boron. The gate regions 520 may be n-doped semiconductor, such as polysilicon doped with Phosphorus. The gate insulator regions 525 may be an insulator, such as silicon dioxide.

In another implementation, the source regions 515 and the drain region 540, 550 may be p-doped semiconductor such as silicon doped with Boron. The body regions 530, 535 may be n-doped semiconductor, such as silicon doped with Phosphorus or Arsenic. The gate regions 520 may be p-doped semiconductor, such as polysilicon doped with Phosphorus. The gate insulator region 525 may be an insulator, such as silicon dioxide.

In another implementation, the source regions 515 may be heavily n-doped (N+) semiconductor, such as silicon doped with Phosphorus or Arsenic. The second drain region 545 proximate the drain contact 550 may be heavily n-doped (N+) semiconductor, such as silicon doped with Phosphorus or Arsenic. The first drain region 540 proximate the body region 530, 535 may be moderately to lightly n-doped (N or N−) semiconductor, such a silicon doped with Phosphorus or Arsenic. The first body regions 530 disposed between the source regions 515 and the first drain region 540 proximate the gate regions 520 may be moderately to lightly p-doped (P or P−) semiconductor, such as silicon doped with Boron. The second body regions 535 proximate the source contact 510 may be heavily p-doped (P+) semiconductor, such as silicon doped with Boron. The gate region 520 may heavily n-doped (N+) semiconductor, such as polysilicon doped with Phosphorus. The gate insulator regions 525 may be an insulator, such as silicon dioxide. The source contact 510 may be a metal or a silicide.

In another implementation, the source regions 515 may be heavily p-doped (P+) semiconductor, such as silicon doped with Boron. The second drain region 545 proximate the drain contact 550 may be heavily p-doped (P+) semiconductor, such as silicon doped with Boron. The first drain region 540 proximate the body region 530, 535 may be moderately to lightly p-doped (P or P−) semiconductor, such a silicon doped with Boron. The first body regions 330 disposed between the source regions 515 and the first drain region 540 proximate the gate regions 520 may be moderately to lightly n-doped (N or N−) semiconductor, such a silicon doped with Phosphorus or Arsenic. The second body regions 535 proximate the source contact 510 may be heavily n-doped (N+) semiconductor, such as silicon doped with Phosphorus or Arsenic. The gate region 520 may heavily p-doped (P+) semiconductor, such as polysilicon doped with Boron. The gate insulator regions 525 may be an insulator, such as silicon dioxide. The source contact 510 may be a metal or a silicide.

The gate regions 520 may be coupled to form a common gate of a non-trench metal-oxide-semiconductor field effect transistor (MOSFET). The source regions 515 may be coupled to form a common source of the MOSFET. The body regions 530, 535 may be coupled to form a common body of the MOSFET, while the portions of the body region disposed proximate the gate regions 520 form a conducting channel of the MOSFET. The drain region 340, 345 forms the drain of the MOSFET.

In addition, the portions of the drain region 540, 545 disposed between the body regions 530, 535 forms a conducting channel of a junction field effect transistor (JFET). The body regions 530, 535 form a gate of the JFET. The source contact 510 and the drain region 540, 545 form the source and drain of the JFET. Furthermore, when the source contact 510 is a metal, a Schottky junction is formed at the interface between the source contact 510 and the drain region 540, 545. The Schottky junction in combination with the JFET form a gated Schottky diode. In the gate Schottky diode the gates pinch off the conduction channel during reverse bias, thereby increasing the breakdown voltage of the Schottky junction and reducing the leakage current. During reverse bias recovery, the Schottky diode increases minority carrier injection into the depletion region. In addition, the resulting body diode is in effect a merged PiN diode.

When the potential of the gate regions 520, with respect to the source regions 515, is increased above the threshold voltage of the device 500, a conducting channel is induced in the body region 530, 535 along the periphery of the gate insulator regions 525. The MOSFET will then conduct current between the drain region 540, 545 and the source regions 515. Accordingly, the device is in its on state.

When the potential of the gate regions 520 is reduced below the threshold voltage, the channel is no longer induced. As a result, a voltage potential applied between the drain region 540, 545 and the source regions 515 will not cause current to flow there between. Accordingly, the MOSFET is in its off state and the depletion region formed in the portion of the first drain region 540, proximate the body regions 530, 535 supports the voltage applied across the source and drain.

It is appreciated that above-described embodiments may be readily modified to form devices including a plurality of MOSFETs arranged in stripe cells, hexagonal cells, mesh cells or the like configuration.

Figure 6A:
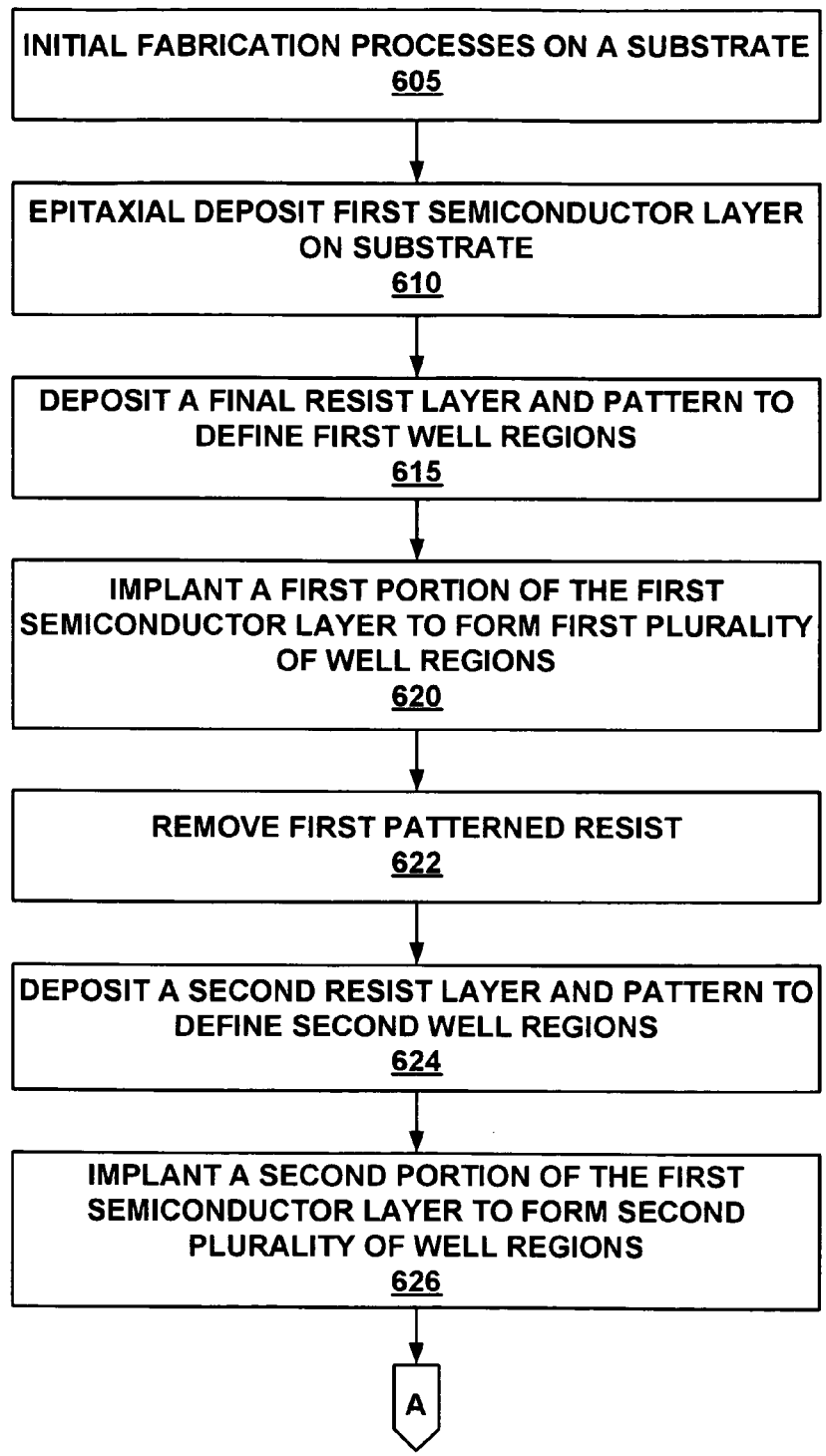
FIGS. 6A, 6B, 6C and 6D show a flow diagram of a method of fabricating a field effect transistor (FET) device, in accordance with another embodiment of the present invention.

Referring now to FIGS. 6A, 6B, 6C and 6D, a flow diagram of a method of fabricating a field effect transistor (FET) device, in accordance with another embodiment of the present invention, is shown. As depicted in FIG. 6A, the method begins, at 605, with various initial processes upon a semiconductor substrate. The various initial processes may include cleaning, depositing, doping, etching and/or the like. The semiconductor substrate may contain a first type of dopant at a first concentration. In an n-channel MOSFET implementation, the substrate may be silicon, gallium arsenide, indium phosphide or the like, heavily doped with Phosphorus or Arsenic (N+) at a concentration of approximately $1.0E17$ $cm^{-3}$ to $1.0E20$ $cm^{-3}$. In a p-channel MOSFET implementation, the substrate may be silicon, gallium arsenide, indium phosphide or the like, heavily doped with Boron (P+).

At 610, a semiconductor layer may be epitaxial deposited upon the substrate. In one implementation, an epitaxial deposited layer of approximately 30 nano-meters (nm) to 400 nm is formed upon the substrate. The epitaxial deposited semiconductor layer may contain the first type of dopant at a second concentration. The semiconductor layer may be doped by introducing the dopant into the epitaxial chamber during deposition. The epitaxial deposited semiconductor layer may also be doped by an optional high-energy implant and thermal anneal process after deposition. In the n-channel MOSFET implementation, the epitaxial deposited semiconductor layer may be silicon, gallium arsenide, indium phosphide or the like, moderately to lightly doped with Phosphorus or Arsenic (N or N-) at a concentration of approximately $5.0E14$ $cm^{-3}$ to $5.0E16$ $cm^{-3}$. In the p-channel MOSFET implementation, the epitaxial deposited semiconductor layer may be silicon, gallium arsenide, indium phosphide or the like, moderately to lightly doped with Boron (P or P-).

At 615, a first photo-resist may be deposited and patterned by any well-known lithography process to define a plurality of body regions. At 620, a second type of dopant may be selectively implanted in the portions of the epitaxial deposited semiconductor layer exposed by the patterned first photo-resist to form a first plurality of well regions. The dopant may be implanted utilizing any well-known ion-implant process at a first energy level. The first doping process results in the formation of first well regions having a second dopant at a third concentration. In the n-channel MOSFET implementation, the first well regions may be moderately to lightly doped with Boron (P or P-)) at a concentration of approximately $5.0E14$ $cm^{-3}$ to $5.0E16$ $cm^{-3}$. In the p-channel MOSFET implementation, the first well regions may be moderately to lightly doped with Phosphorus or Arsenic (N or N-). The first wells form a plurality of lightly to moderately doped body regions of the MOSFET.

At 622, the first patterned photo-resist is removed utilizing an appropriate resist stripper or resist ashing process. At optional process 624, a second photo-resist may be deposited and patterned by any well-known lithography process to define a second plurality of wells disposed within the first plurality of wells. At 626, the second type of dopant may be selectively implanted in the portions of the epitaxial deposited semiconductor layer exposed by the patterned second photo-resist to form a second plurality of well regions disposed within the first plurality of well regions. The second type of dopant may be implanted at a second energy level that is less than the first energy level. The second doping process results in the formation of second well regions having the second dopant at fourth concentration. In the n-channel MOSFET implementation, the second well regions may be heavily doped with Boron (P or P-) at a concentration of approximately $5.0E16$ $cm^{-3}$ to $1.0E20$ $cm^{-3}$. In the p-channel MOSFET implementation, the second well regions may be heavily doped with Phosphorus or Arsenic (N or N-). The second wells form a plurality of heavily doped body regions of the MOSFET. The first and second well regions also form a plurality of gate regions of a JFET. The channel of the JFET is formed by a portion of the epitaxial deposited layer disposed between the second plurality of well regions.

Figure 6B:
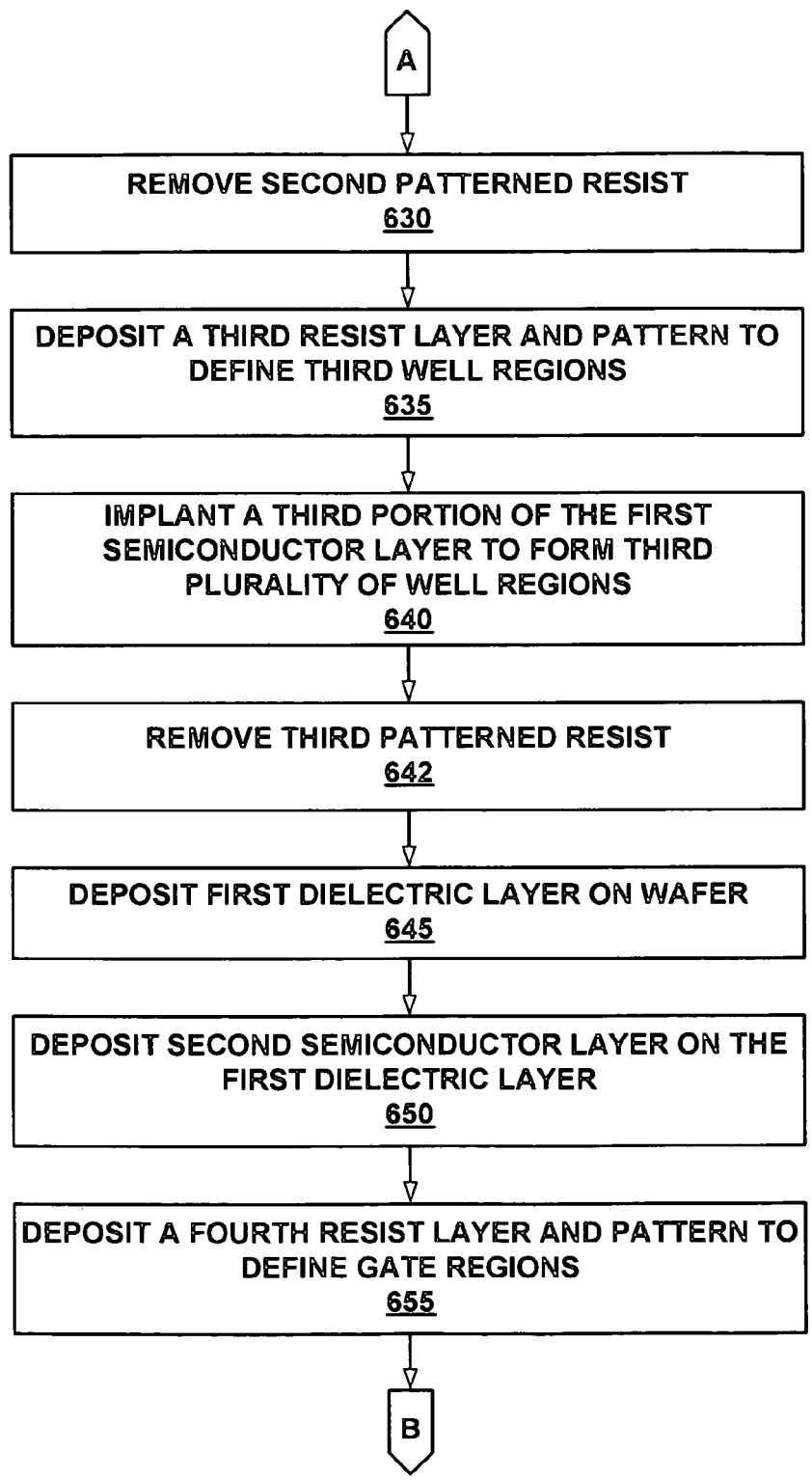

Referring now to FIG. 6B, the second patterned photo-resist is removed utilizing an appropriate resist stripper or resist ashing process, at 630. At 635, a third photo-resist may be deposited and patterned by any well-known lithography process to define a plurality of a third set of wells disposed within the first set of wells. The openings in the third pattern photo-resist are smaller than the first and second well regions. The openings in the third patterned photo-resist are aligned to be substantially centered within the first plurality of well regions. At 640, the first type of dopant may be selectively implanted in the portions of the epitaxial deposited semiconductor layer exposed by the patterned third photo-resist to form a third plurality of well regions disposed within the first and second well regions. The dopant may be implanted at a third energy level. The third doping process results in the formation of third well regions having the first dopant at a fifth concentration. In the n-channel MOSFET implementation, the third well regions may be heavily doped with Phosphorus or Arsenic (N+) at a concentration of approximately $1.0E17$ $cm^{-3}$ to $1.0E20$ $cm^{-3}$ cm. In the p-channel MOSFET implementation, the third well regions may be heavily doped with Boron (P+). The third wells form a plurality of source regions of the MOSFET.

At 642, the third patterned photo-resist is removed utilizing an appropriate resist stripper or resist ashing process. At 645, a first dielectric layer may be formed on the wafer. The first dielectric layer may be formed by any well-known oxidation or deposition processes. In one implementation, the dielectric is formed by oxidizing the surface of the silicon wafer to form a silicon dioxide layer. In one implementation the first dielectric layer may be approximately 15 nm to 200 nm thick. The resulting dielectric forms a portion of a plurality of gate insulator regions of the MOSFET upon a fourth portion of the first semiconductor layer proximate the first plurality of well regions.

Figure 6C:
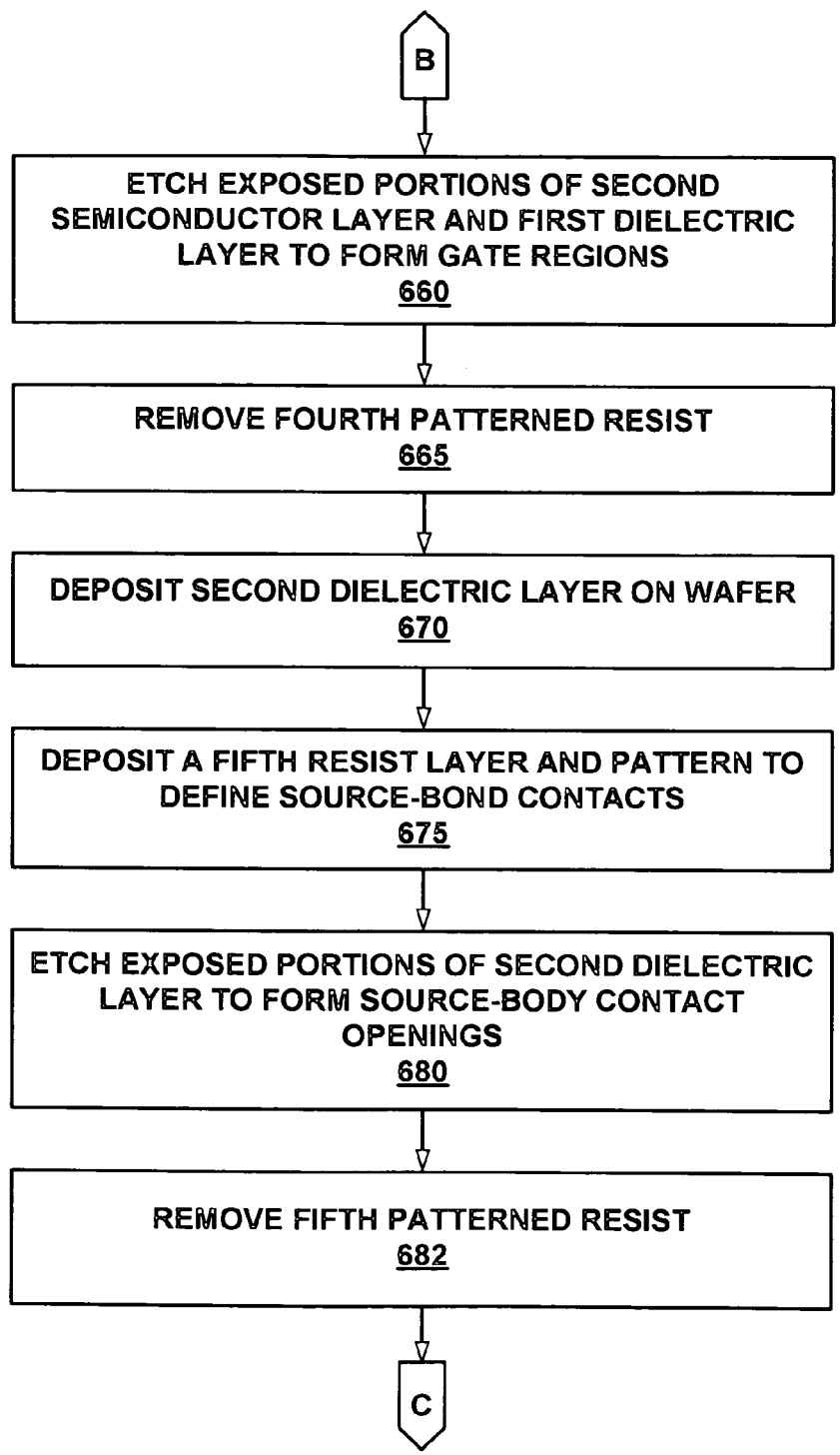

At 650, a polysilicon layer is deposited on the first dielectric layer. In one implementation, the polysilicon is deposited by a method such as decomposition of silane ($SiH_4$). The polysilicon may be doped by introducing the impurity during the deposition process or in a separate doping process. In the n-channel MOSFET implementation, the polysilicon may be heavily doped with Phosphorus or Arsenic (N+) at a concentration of approximately $1.0E17$ $cm^{-3}$ to $1.0E20$ $cm^{-3}$. In the p-channel MOSFET implementation, the polysilicon may be heavily doped with Boron (P+). At 655, a fourth photo-resist may be deposited and patterned by any well-known lithography process to define the gate regions. Referring now to FIG. 6C, the portions of the first dielectric layer, polysilicon layer and second dielectric layer exposed by the fourth patterned photo-resist may be removed by any well-known etching process, at 660. At 665, the fourth patterned photo-resist layer may be removed utilizing an appropriate resist stripper or resist ashing process.

At 670, a second dielectric layer is on the wafer. The second dielectric layer completes the gate insulator regions disposed about the gate regions. The second dielectric layer may be formed by any well-known oxidation processes. At 675, a fifth photo-resist may be deposited and patterned by any well-known lithography process to define a plurality of source-body contact openings between the gate regions. At 680, the portions of the second dielectric layer exposed by the fifth patterned photo-resist may be removed by any well-known etching process. At 682, the fifth patterned photo-resist layer may be removed utilizing an appropriate resist stripper or resist ashing process.

Figure 6D:
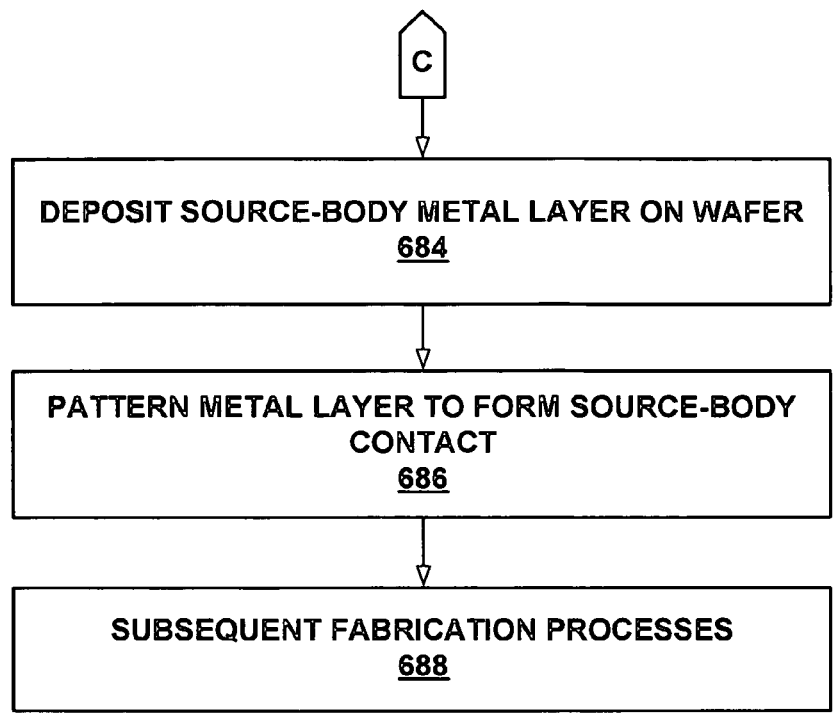

Referring now to FIG. 6D, a source-body metal layer is deposited on the surface of the wafer, at 684. The source-body metal layer may be deposited such that the first second and third plurality of well regions and a fourth portion of the first semiconductor layer disposed between the second plurality of well regions are electrically coupled to each other. In one implementation, the source-body metal layer is deposited by any well-known method such as sputtering. The source-body metal layer forms a contact with the body and source regions left exposed by the patterned second dielectric layer. The source-body metal layer is isolated from the gate region by the patterned first second and third dielectric layers. The source-body metal layer also forms a Schottky barrier at the interface of the epitaxial deposited layer disposed between the first, second and third well regions. The source-body metal layer is then patterned utilizing a photo-resist mask and selective etching method as needed, at 686. At 688, fabrication continues with various other processes. The various processes typically include etching, deposition, doping, cleaning, annealing, passivation, cleaving and/or the like.

Accordingly, embodiments of the present invention provide JFET devices provide JFET devices having reduced leakage current and/or faster switching, as compared to conventional power MOSFET devices. The JFET devices having reduced leakage current and/or faster switching characteristics may advantageously be utilized in many applications such as high-frequency DC-DC converters and the like.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A field effect transistor comprising:
a semiconductor substrate having a top surface and a bottom surface, wherein the semiconductor substrate includes a drain region therein;
a trench gate region extending into the semiconductor substrate for a first predetermined depth, wherein the trench gate region is insulated from the semiconductor substrate by a gate insulator region;
a pair of source regions in the semiconductor substrate and disposed on opposite sides of the trench gate region;
a pair of body regions extending into the semiconductor substrate for a second predetermined depth and disposed on opposite sides of the trench gate region, wherein each of the body regions separates a respective source region from the drain region and the second predetermined depth is less than the first predetermined depth;
a source metal contact disposed on the top surface of the semiconductor substrate, wherein the source metal contact is in physical contact with the pair of source regions, the pair of body regions, and a portion of the drain region, wherein the source metal contact is insulated from the trench gate region by the gate insulator region; and
a drain metal contact disposed on the bottom surface of the semiconductor substrate, wherein the drain metal contact is in physical contact with the drain region;
wherein each of the body regions further includes a lightly-doped body region below a respective source region and a heavily-doped body region above the lightly-doped body region such that the heavily-doped body region is in physical contact with the source metal contact and the lightly-doped body region is not in physical contact with the source metal contact.

2. The field effect transistor of claim 1, wherein:
the pair of source regions and the drain region are n-doped; and
the pair of body regions are p-doped.

3. The field effect transistor of claim 2, wherein said drain region comprises:
a heavily n-doped portion and a lightly n-doped portion;
wherein the heavily n-doped portion is in physical contact with the drain metal contact and the lightly n-doped portion is in physical contact with the pair of body regions and the source metal contact.

4. The field effect transistor of claim 2, wherein:
the lightly p-doped body region is disposed between the respective source region, the gate insulator region, and the drain region proximate the trench gate region; and
the heavily p-doped body region is disposed between the drain region, the lightly p-doped body region, the respective source region, and the source metal contact.

5. The field effect transistor of claim 1, wherein:
the pair of source regions and the drain region are p-doped; and
the pair of body regions are n-doped.

6. The field effect transistor of claim 5, wherein said drain region comprises:
a heavily p-doped portion and a lightly p-doped portion;
wherein the heavily p-doped portion is in physical contact with the drain metal contact and the lightly p-doped portion is in physical contact with the pair of body regions and the source metal contact.

7. The field effect transistor of claim 5, wherein:
the lightly n-doped body region is disposed between the respective source region, the gate insulator region, and the drain region proximate the trench gate region; and
the heavily n-doped body region is disposed between the drain region, the lightly n-doped body region, the respective source region, and the source metal contact.

8. The field effect transistor of claim 1, further comprising a Schottky junction disposed at the top surface where the source metal contact is physical contact with the portion of the drain region.

9. The field effect transistor of claim 1, wherein said pair of source regions are formed as substantially parallel elongated structures.

10. A field effect transistor comprising:
a first and second trench gate regions extending into a semiconductor substrate for a first predetermined depth;
a first source region disposed in the semiconductor substrate and proximate the first trench gate region;
a second source region disposed in the semiconductor substrate and proximate the second trench gate region;
a first lightly-doped body region disposed below said first source region proximate said first trench gate region and extending into the semiconductor substrate for a depth that is less than the first predetermined depth;
a second lightly-doped body region disposed below said second source region proximate said second trench gate region and extending into the semiconductor substrate for a depth that is less than the first predetermined depth;
a third heavily-doped body region disposed in the semiconductor substrate and adjacent said first source region and above said first lightly-doped body region;
a fourth heavily-doped body region disposed in the semiconductor substrate and adjacent said second source region and above said second lightly-doped body region;
a drain region disposed in the semiconductor substrate and between said first and second lightly-doped body regions and said third and fourth heavily-doped body regions and between said first and second gate regions, wherein said first lightly-doped body region and said third heavily-doped body region are disposed between said drain region and said first source region and wherein said second lightly-doped body region and said fourth heavily-doped body region are disposed between said drain region and said second source region;
a source contact disposed on a top surface of the semiconductor substrate and-in physical contact with said first and second source regions, said third and fourth heavily-doped body regions and a portion of said drain region disposed between said first and second trench gate regions;
a first gate insulator region insulating said first trench gate region from said first source region, said first lightly-doped body region, said drain region, and said source contact; and
a second gate insulator region insulating said second trench gate region and said second source region, said second lightly-doped body region, said drain region, and said source contact.

11. The field effect transistor of claim 10, wherein:
said first and second source regions comprise an n-doped semiconductor;
said drain region comprises an n-doped semiconductor; and
said first and second lightly-doped body regions comprise a p-doped semiconductor.

12. The field effect transistor of claim 11, wherein said drain region comprises: a heavily n-doped portion; and
a lightly n-doped portion disposed between said heavily n-doped portion and said first and second lightly-doped body regions, said third and fourth heavily-doped body regions, and said source contact.

13. The field effect transistor of claim 11, wherein:
said first lightly-doped body region comprises a lightly p-doped portion disposed between said first source region and said drain region proximate said gate region;
said third heavily-doped body region comprises a heavily p-doped portion disposed proximate said drain region and said source contact;
said second lightly-doped body region comprises a lightly p-doped portion disposed between said second source region and said drain region proximate said gate region; and
said fourth heavily-doped body region comprises a heavily p-doped portion disposed proximate said drain region and said source contact.

14. The field effect transistor of claim 11, wherein:
said first and second source regions comprise a p-doped semiconductor;
said drain region comprises a p-doped semiconductor; and
said first and second lightly-doped body regions comprise an n-doped semiconductor.

15. The field effect transistor of claim 14, wherein said drain region comprises:
a heavily p-doped portion; and
a lightly p-doped portion disposed between said heavily p-doped portion and said first and second lightly-doped body regions, said third and fourth heavily-doped body regions, and said source contact.

16. The field effect transistor of claim 14, wherein:
said first lightly-doped body region comprises a lightly n-doped portion disposed between said first source region and said drain region proximate said first gate region;
said third heavily-doped body region comprises a heavily n-doped portion disposed proximate said source contact;
said second lightly-doped body region comprises a lightly n-doped portion disposed between said second source region and said drain region proximate said second gate region; and
said fourth heavily-doped body region comprises a heavily n-doped portion disposed proximate said source contact.

17. The field effect transistor of claim 10, further comprising a Schottky junction disposed at an interface between said source contact and said portion of said drain region proximate said first and second lightly-doped body regions.

18. The field effect transistor of claim 10, wherein said first and said second gate regions are formed as substantially parallel elongated structures.

* * * * *